US012449492B2

(12) United States Patent
Shinden et al.

(10) Patent No.: US 12,449,492 B2
(45) Date of Patent: Oct. 21, 2025

(54) COOLING DEVICE

(71) Applicant: CANON MEDICAL SYSTEMS CORPORATION, Otawara (JP)

(72) Inventors: Yasunobu Shinden, Otawara (JP); Teruo Hashimoto, Otawara (JP); Toshikazu Shimmei, Nasushiobara (JP); Shintaro Inoue, Nasushiobara (JP); Kenichi Murata, Nasushiobara (JP); Hajime Tanaka, Kodaira (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 164 days.

(21) Appl. No.: 18/449,004

(22) Filed: Aug. 14, 2023

(65) Prior Publication Data

US 2024/0077553 A1 Mar. 7, 2024

(30) Foreign Application Priority Data

Sep. 1, 2022 (JP) ................. 2022-139237

(51) Int. Cl.
*G01R 33/38* (2006.01)
*G01R 33/36* (2006.01)

(52) U.S. Cl.
CPC ...... *G01R 33/3804* (2013.01); *G01R 33/3614* (2013.01)

(58) Field of Classification Search
CPC . G01R 33/3804; G01R 33/3614; G01R 33/28
See application file for complete search history.

(56) References Cited

U.S. PATENT DOCUMENTS

| 5,706,668 A * | 1/1998 | Hilpert ............... H05K 7/20818 361/696 |
| 2009/0154091 A1* | 6/2009 | Yatskov .................. F28F 1/022 165/104.33 |
| 2012/0127657 A1* | 5/2012 | Keisling ............ H05K 7/20763 361/679.53 |
| 2012/0249134 A1 | 10/2012 | Rapoport et al. |
| 2016/0178717 A1* | 6/2016 | Jiang ..................... G01R 33/36 324/322 |
| 2019/0150326 A1* | 5/2019 | Gao ................... H05K 7/20745 361/679.47 |
| 2022/0003827 A1* | 1/2022 | Yang .................... H05K 7/2089 |

FOREIGN PATENT DOCUMENTS

JP 3178147 U 9/2012

* cited by examiner

*Primary Examiner* — Daniel R Miller
(74) *Attorney, Agent, or Firm* — Oblon, McClelland, Maier &Neustadt, L.L.P.

(57) ABSTRACT

According to an embodiment, a cooling device for cooling a constituent element housed in a housing of a unit subjected to an influence of a generated magnetic field includes a water cooling mechanism and at least one air cooling mechanism. The water cooling mechanism cools the constituent element by cooling a cooling plate with a flow of water flowing through a pipe passing through the cooling plate arranged in the housing. The air cooling mechanism is arranged on an outgoing side where the flow of water flowing through the pipe is outgoing from the housing and cools the constituent element by discharging air in the housing along with the water flow in accordance with the water flow.

8 Claims, 6 Drawing Sheets

COOLING DEVICE

CROSS-REFERENCE TO RELATED APPLICATION

The present application claims priority based on Japanese Patent Application No. 2022-139237, filed Sep. 1, 2022, the content of which is incorporated herein by reference.

FIELD

Embodiments of the disclosure in the present specification and the drawings relate to a cooling device.

BACKGROUND

A magnetic resonance imaging (MRI) device has conventionally been used as a medical diagnostic imaging device for performing image-based diagnosis. A magnetic resonance imaging device (hereinafter referred to as an "MRI device") is a device for capturing a tomogram of a subject by receiving an MR signal excited by a radio frequency (RF) pulse radiated in a strong magnetic field with an RF coil.

Meanwhile, a constituent element (an internal unit) provided in a gantry device constituting the MRI device has a high temperature due to an increase in a temperature along with an operation. For this reason, the MRI device requires cooling of the high-temperature internal unit. As a cooling mechanism for cooling the high-temperature internal unit, for example, an air cooling mechanism, a water cooling mechanism, or the like is considered. The air cooling mechanism is, for example, a mechanism for cooling the part in the internal unit by externally discharging air warmed in the internal unit by rotating a fan with a motor. The water cooling mechanism is, for example, a mechanism for cooling a part arranged near a cooling plate in the internal unit by circulating cooling water or the like through a pipe arranged in the cooling plate to cool the cooling plate.

However, an internal unit configured to cool the internal part with the air cooling mechanism using a fan cannot be installed near a gantry device constituting the MRI device or in a room identical to an imaging room where the gantry device is installed. That is, the air cooling mechanism using the fan cannot be installed in an environment where there is a magnetic field. This is because the motor for rotating the fan in the air cooling mechanism uses, for example, a permanent magnet, an electromagnet, or the like, and therefore, there is a possibility that sufficient performance will not be exhibited due to the influence of the magnetic field generated by the MRI device for imaging when the internal unit is installed near the gantry device or in the imaging room where the gantry device is installed.

For this reason, in conventional MM devices, when a part inside of an internal unit is cooled by an air cooling mechanism, the air cooling mechanism is installed in a room different from an imaging room where a gantry device for generating a magnetic field is installed, for example, in a machinery room not affected by the magnetic field or the like. In the conventional MRI device, an air passageway for guiding air warmed in the internal unit such as an exhaust duct into the machinery room is laid between the imaging room and the machinery room, and an air cooling mechanism installed in the machinery room suctions air in the internal unit via the exhaust duct and discharges the air into the machinery room. In a configuration in which the internal part is cooled by suctioning the air in the internal unit via such an exhaust duct, a case where the efficiency of the air cooling function of the air cooling mechanism deteriorates because an air flow channel becomes long is taken into account. Furthermore, because it is necessary to install the exhaust duct between the imaging room and the machinery room when introducing the MRI device, the construction costs are likely to be high due to the significantly large scale of this construction.

DETAILED DESCRIPTION

According to an embodiment, a cooling device for cooling a constituent element housed in a housing of a unit subjected to an influence of a generated magnetic field includes a water cooling mechanism and at least one air cooling mechanism. The water cooling mechanism cools the constituent element by cooling a cooling plate with a flow of water flowing through a pipe passing through the cooling plate arranged in the housing. The air cooling mechanism is arranged on an outgoing side where the flow of water flowing through the pipe is outgoing from the housing and cools the constituent element by discharging air in the housing along with the water flow in accordance with the water flow.

The cooling device of the embodiment will be described below with reference to the drawings. In the following description, it is assumed that the medical diagnostic device using the cooling device according to the embodiment is a magnetic resonance imaging (MRI) device (hereinafter referred to as an "MRI device").

This MRI device is a medical diagnostic device for radiating a high-frequency radio frequency (RF) pulse in a state in which a strong magnetic field is applied to a subject (for example, a human body), receiving electromagnetic waves generated from hydrogen nuclei in the body of the subject due to a nuclear magnetic resonance phenomenon with an RF coil, and capturing a tomographic image (hereinafter referred to as an "MR image") of the subject on the basis of a nuclear magnetic resonance signal (hereinafter referred to as an "MR signal") based on the received electromagnetic waves. The MRI device may capture the MR image of the subject on the basis of the MR signal based on the electromagnetic waves received by the RF coil attached to the subject. The MRI device displays the MR image of the subject, and therefore, an MRI examiner (a doctor, an engineer, or the like) can visually confirm whether or not the subject has a lesion.

Figure 1:
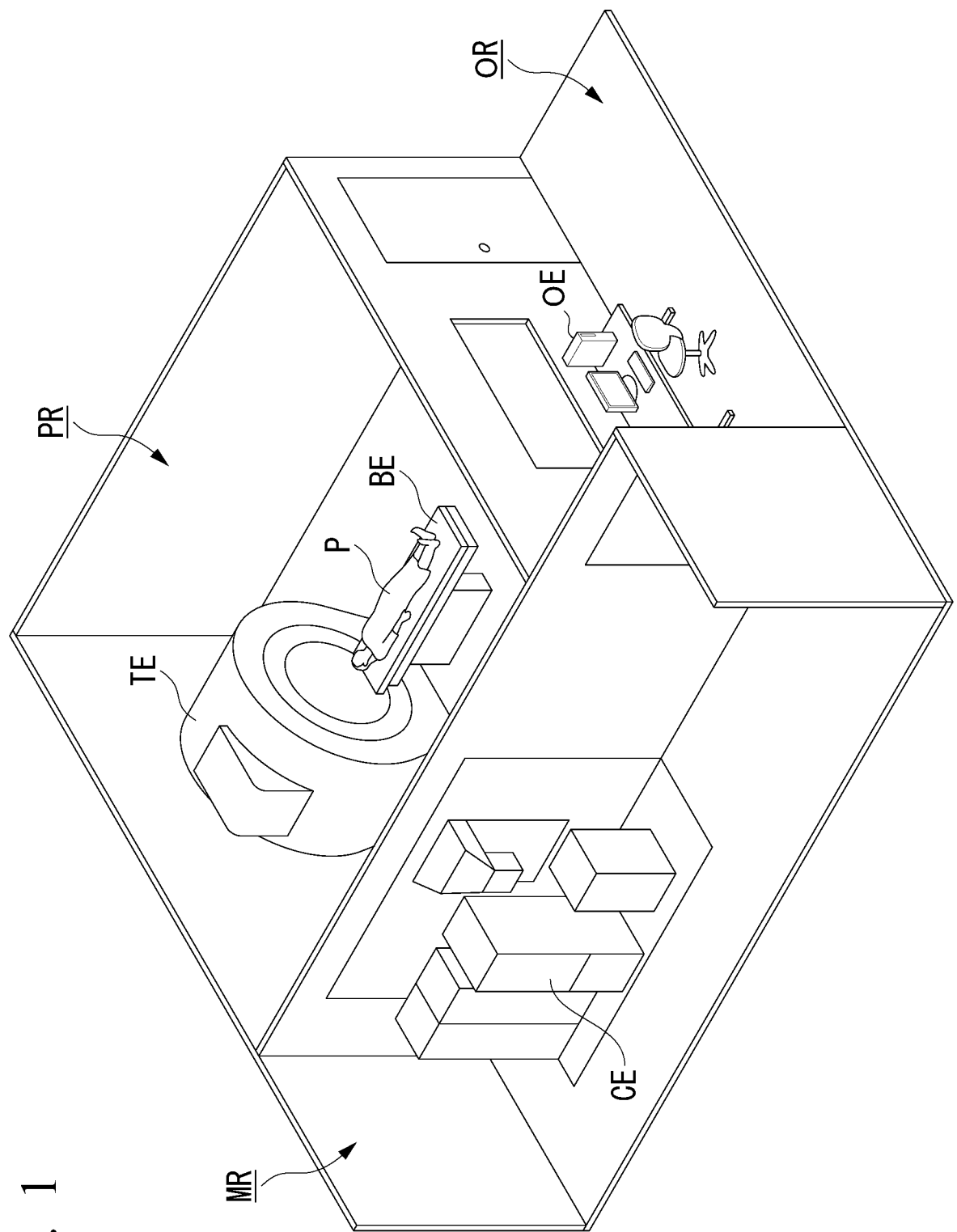
FIG. 1 is a diagram schematically showing an example of an installation state of a medical diagnostic device adopting a cooling device according to an embodiment.

FIG. 1 is a diagram schematically showing an example of the installation state of a medical diagnostic device (an MRI device) adopting the cooling device according to the embodiment. In the example shown in FIG. 1, for example, a case where a bed device BE including a subject tabletop plate on which a subject P to be examined is placed and a gantry device TE configured to generate a magnetic field for imaging the subject P, irradiate the subject P with an RF pulse, and receive an MR signal are installed in an imaging room PR is shown. Furthermore, in an example shown in FIG. 1, for example, a case where the MRI examiner (a doctor, an engineer, or the like) installs a console device OE for issuing an instruction by performing an operation when the subject P is imaged in an operation room OR and a device such as a control device CE for controlling an operation of the gantry device TE or the bed device BE in accordance with the instruction from the console device OE in the machinery room MR is shown. In FIG. 1, the imaging room PR is a room shielded so that the magnetic field generated by the gantry device TE does not leak into the operation room OR or the machinery room MR. Thus, in an example shown in FIG. 1, only the imaging room PR becomes an environment (a magnetic field environment) where there is a magnetic field generated by the gantry device TE. The devices constituting the MRI device installed in each room are electrically connected to each other, for example, by a cable.

In the MRI device, there is also a constituent element (hereinafter referred to as an "internal unit") in which the temperature rises and becomes high along with the operation of the gantry device TE. The high-temperature internal unit includes, for example, a magnetic field power supply for generating a strong magnetic field, a high-frequency amplification unit for radiating high-frequency RF pulses, and the like. For this reason, each high-temperature internal unit includes, for example, a cooling mechanism such as an air cooling mechanism or a water cooling mechanism for cooling an internal part. In the following description, it is assumed that the high-temperature internal unit is a high-frequency amplification device (hereinafter referred to as a "high-frequency amplification unit").

The high-frequency amplification unit is a device (an internal unit) for amplifying a high-frequency signal for irradiating an RF coil provided in the gantry device TE with an RF pulse output by the control device CE in accordance with an imaging instruction from the console device OE. For example, a semiconductor integrated circuit such as a large-scale integration (LSI) circuit for generating a high-frequency signal or a circuit board (hereinafter referred to as an "amplification circuit board") on which an amplification circuit for amplifying the generated high-frequency signal is mounted is embedded in the high-frequency amplification unit. In the amplification circuit board, for example, parts mainly constituting an amplification circuit, such as a power amplifier, a coil, and a transformer, are causes of a high temperature due to an operation that is performed by a high-frequency amplification unit. The high-frequency amplification unit is an example of a "unit subjected to an influence of a generated magnetic field," and the part constituting the amplification circuit is an example of a constituent element housed in a housing of the unit subjected to an influence of the generated magnetic field.

Figure 2:
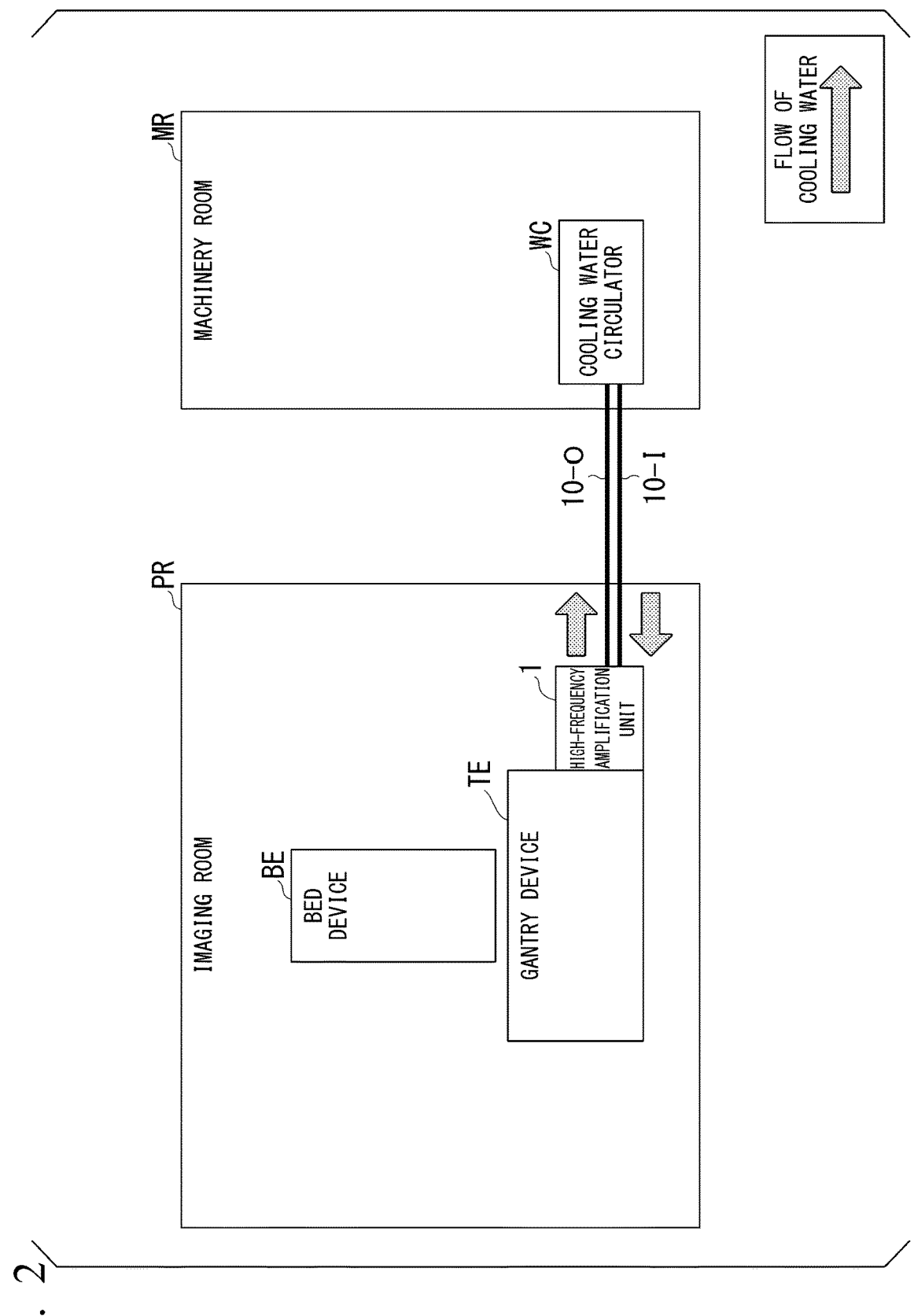
FIG. 2 is a diagram schematically showing an example of an installation state of a constituent element to be cooled by the cooling device according to the embodiment.

Next, a cooling mechanism for cooling the high-frequency amplification unit connected to the gantry device TE constituting the MRI device will be described. The high-frequency amplification unit includes both an air cooling mechanism and a water cooling mechanism as a cooling mechanism. FIG. 2 is a diagram schematically showing an example of an installation state of a constituent element (the high-frequency amplification unit) that is cooled by the cooling device according to the embodiment. As shown in FIG. 2, the high-frequency amplification unit 1 is installed adjacent to the gantry device TE. A cooling water pipe 10 for the water cooling mechanism is connected (piped) to the high-frequency amplification unit 1 and the cooling water pipe is connected to a cooling water circulator WC installed in the machinery room MR.

The cooling water circulator WC circulates cooling water with the water cooling mechanism provided in the high-frequency amplification unit 1. In FIG. 2, cooling water pipes 10, i.e., a cooling water pipe 10-I for causing the cooling water outgoing from the cooling water circulator WC to be incoming to the high-frequency amplification unit 1 and a cooling water pipe 10-O for causing the cooling water outgoing from the high-frequency amplification unit 1 after passing through the inside of the high-frequency amplification unit 1 to be input to the cooling water circulator WC, are shown.

A configuration of the water cooling mechanism in the high-frequency amplification unit 1, i.e., a configuration of the water cooling mechanism in which the high-frequency amplification unit 1 and the cooling water circulator WC are connected by the cooling water pipe 10, is equivalent to a configuration of the water cooling mechanism of the internal unit in the conventional MM device.

On the other hand, the configuration of the air cooling mechanism in the high-frequency amplification unit 1 is different from the configuration of the air cooling mechanism of the internal unit in the conventional MM device. More specifically, in the configuration of the air cooling mechanism of the internal unit in the conventional MRI device, for example, a fan is rotated by a motor using a permanent magnet, an electromagnet, or the like, and air warmed in the internal unit is externally discharged. For this reason, in the conventional MM device, when the internal unit is arranged in the imaging room PR as shown in FIG. 2, it is necessary to install the air cooling mechanism using the fan in the machinery room MR, connect the internal unit and the air cooling mechanism through, for example, an exhaust duct or the like, and guide the air warmed in the internal unit to the air cooling mechanism. On the other hand, in the configuration of an air cooling mechanism in the high-frequency amplification unit 1, air warmed by a part constituting the amplification circuit mounted on the amplification circuit board embedded in the high-frequency amplification unit 1 is discharged to the outside of the high-frequency amplification unit 1 without using a fan.

[Example of Configuration of Cooling Mechanism in Internal Unit]

Figure 3:
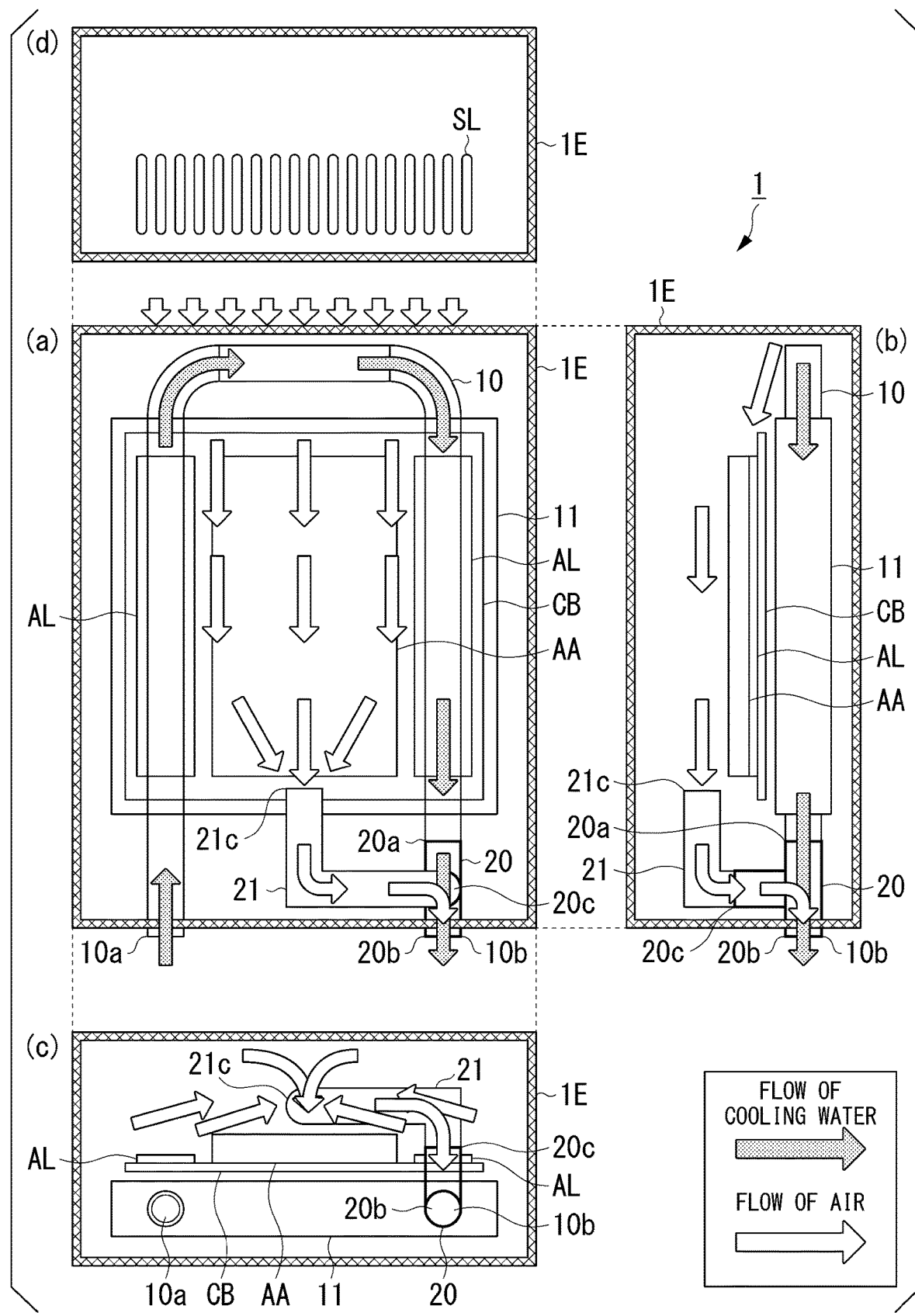
FIG. 3 is a diagram schematically showing an example of a configuration of an internal unit adopting the cooling device according to the embodiment.

Next, an example of the configuration of the cooling mechanism provided in the high-frequency amplification unit 1 will be described. FIG. 3 is a diagram schematically showing an example of the configuration of the internal unit (the high-frequency amplification unit 1) adopting the cooling device according to the embodiment. An example of an arrangement of constituent elements when the high-frequency amplification unit 1 is viewed from the upper surface side is shown in (a) of FIG. 3, an example of the arrangement of the constituent elements when the high-frequency amplification unit 1 is viewed from the right surface side is shown in (b) of FIG. 3, an example of the arrangement of the constituent elements viewed from the front surface side where the cooling water pipe 10 is connected to the high-frequency amplification unit 1 is shown in (c) of FIG. 3, and a rear surface view of the high-frequency amplification unit 1 viewed from the rear surface side is shown in (d) of FIG. 3.

In the high-frequency amplification unit 1, an amplification circuit board CB on which a part for implementing a function of amplifying a high-frequency signal is mounted is embedded in a housing 1E. In FIG. 3, an example of a case where the amplification circuit board CB on which a semiconductor part such as an LSI circuit is mounted in a semiconductor integrated circuit mounting region AL and parts (for example, a power amplifier, a coil, a transformer, and the like) constituting an amplification circuit are mounted in an amplification circuit mounting region AA is shown.

A water cooling mechanism for cooling a part mounted on the amplification circuit board CB with the running water that is cooling water is arranged on the lower side of the amplification circuit board CB in the housing 1E of the high-frequency amplification unit 1. In FIG. 3, an example of a water cooling mechanism in which the cooling water pipe 10 bent in a U-shape passes through the cooling plate 11 is shown. In the water cooling mechanism, the cooling plate 11 is formed of, for example, a metal such as aluminum, and the cooling water pipe 10 is formed of, for example, a metal such as copper. In the water cooling mechanism, the cooling water flowing from the cooling water circulator WC through the cooling water pipe 10-I is incoming from the inlet 10a of the cooling water pipe 10 and is outgoing from the outlet 10b of the cooling water pipe to the cooling water circulator WC through a portion bent in the U-shape and through the cooling water pipe 10-O (see FIG. 2). In (a), (b), and (c) of FIG. 3, examples of the flow of cooling water in the water cooling mechanism are schematically shown. In the water cooling mechanism provided in the high-frequency amplification unit 1, cooling water flowing through the cooling water pipe 10 cools a part mounted on the amplification circuit board CB arranged on an upper side by cooling the cooling plate 11. In the example shown in (a) of FIG. 3, semiconductor parts mounted in the semiconductor integrated circuit mounting region AL are mainly cooled.

In the water cooling mechanism, a path along which the cooling water pipe 10 passes through the cooling plate 11, i.e., a path along which the cooling water is circulated in the cooling plate 11 is not limited to the U-shape shown in FIG. 3, and any path for implementing a path of the cooling water capable of cooling a part to be cooled may be used.

The configuration of the cooling water pipe 10 and the cooling plate 11 is an example of a "water cooling mechanism."

The high-frequency amplification unit 1 includes an aspirator 20 and a suction pipe 21 as the air cooling mechanism for cooling the part mounted on the amplification circuit board CB. In FIG. 3, an example of the air cooling mechanism in which the aspirator 20 is arranged at the end of the cooling water pipe 10 on the outlet 10b side, one end of the suction pipe 21 is connected to a suction port 20c of air in the aspirator 20, and the other end of the suction pipe 21 is arranged at any position in the housing 1E is shown. In the air cooling mechanism, the aspirator 20 suctions air from the suction port 20c side according to a Venturi effect using a fluid and discharges the suctioned air along with the fluid. More specifically, the aspirator 20 uses cooling water flowing into the cooling water pipe 10 as a fluid, suctions air in the housing 1E warmed by a part mounted on the amplification circuit board CB from the other end side (hereinafter referred to as a "suction port 21c") of the suction pipe 21, and discharges the suctioned air along with the cooling water from the outlet 10b. Thus, the cooling water circulator WC for circulating cooling water with the water cooling mechanism provided in the high-frequency amplification unit 1 removes air incoming along with the cooling water from the outlet 10b of the high-frequency amplification unit 1 through the cooling water pipe 10-O and causes cooling water, which does not include air, to be outgoing to the inlet 10a of the high-frequency amplification unit 1 through the cooling water pipe 10-I (see FIG. 2).

Figure 4:
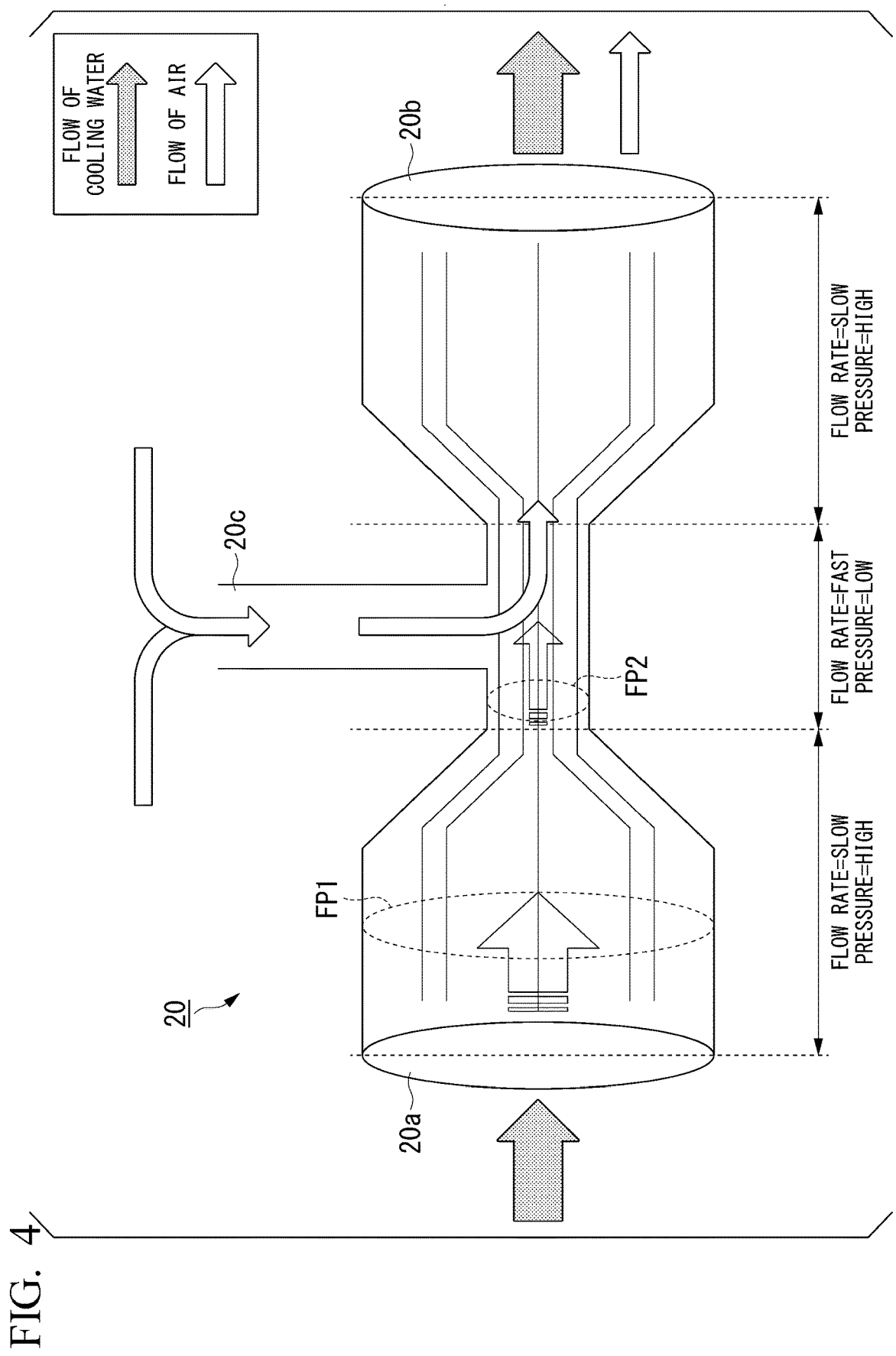
FIG. 4 is a diagram schematically showing a constituent element for air cooling in the cooling device according to the embodiment and an example of its operation.

Here, an example of the operation of the aspirator 20 is described. FIG. 4 is a diagram schematically showing a constituent element (the aspirator 20) for air cooling in the cooling device according to the embodiment and an example of its operation. The aspirator 20 suctions air using the Venturi effect of increasing a rate (a flow rate) at which the fluid passing through it flows by narrowing the flow of cooling water that is the fluid and consequently lowering pressure at a portion where the flow rate of the fluid has been increased, compared with pressures at other portions. In FIG. 4, an example of a case where a flow channel diameter FP1 on the inlet 20a side is narrowed down to a flow channel diameter FP2 (the flow channel diameter to making thinner) during a period until the cooling water is incoming from the inlet 20a of the aspirator 20 and outgoing from the outlet 20b is shown. In the aspirator 20, the flow rate of the cooling water in the portion of the flow channel diameter FP2 is increased by narrowing the flow channel diameter. Thereby, in the aspirator 20, the pressure of the portion of the flow channel diameter FP2 is reduced as compared with the pressure of the portion of the flow channel diameter FP1. In FIG. 4, a relationship between the flow rate and the pressure in each portion of the aspirator 20 is schematically shown. Thereby, as shown in FIG. 4, air is suctioned from the suction port 20c due to a decrease in the pressure of the portion of the flow channel diameter FP2 in the aspirator 20. Also, the aspirator 20 discharges the air suctioned from the suction port 20c from the outlet 20b along with the cooling water.

An amount (suction amount) of suctioning air from the suction port 20c in the aspirator 20 can be adjusted by changing an amount of narrowing a flow of cooling water, i.e., by changing a difference between the flow channel diameter FP1 and the flow channel diameter FP2 and by changing an amount of increase in the flow rate of the fluid. Therefore, it is only necessary to make an adjustment so that the difference between the flow channel diameter FP1 and the flow channel diameter FP2 in the aspirator 20 is a discharge amount necessary for discharging air in the housing 1E warmed by the part mounted on the amplification circuit board CB in the high-frequency amplification unit 1.

In (a), (b), and (c) of FIG. 3, examples of the flow of air based on the air cooling mechanism are schematically shown. In the air cooling mechanism, air in the housing 1E warmed by a part mounted on the amplification circuit board CB is suctioned from the suction port 21c of the suction pipe 21 and discharged along with cooling water from the outlet 20b of the aspirator 20, i.e., the outlet 10b of the water cooling mechanism provided in the high-frequency amplification unit 1. For this reason, in the high-frequency amplification unit 1, as shown in (d) in FIG. 3, a slit SL for taking in fresh air in the imaging room PR not warmed by a part mounted on the amplification circuit board CB is provided on the rear surface side of the high-frequency amplification unit 1.

The configuration of the aspirator 20 and the suction pipe 21 (may include the slit SL) is an example of an "air cooling mechanism." The cooling water pipe 10 is an example of "a pipe passing through the cooling plate" and "a pipe."

In the air cooling mechanism, a shape of an intake port for taking in fresh air (the slit SL in (d) of FIG. 3) and a position where the intake port is provided are not limited to the lower portion of the rear surface side of the high-frequency amplification unit 1 as shown in (d) of FIG. 3, if the shape and the position are provided so that the air warmed in the housing 1E can be efficiently discharged (for example, evenly from the inside of the housing 1E). For example, an intake port for taking in fresh air in the air cooling mechanism may also be provided on an upper portion of the rear surface side of the high-frequency amplification unit 1 and a side surface (one or both of a right side surface and a left side surface) of the high-frequency amplification unit 1.

The shape of the suction pipe 21 and the configuration of the suction pipe 21, i.e., a path for guiding the air suctioned from the suction port 21c to the suction port 20c of the aspirator 20 and an air suction method, are not limited to the shape and configuration of the suction pipe 21 shown in FIG. 3, and any shape and configuration may be provided as long as they are a shape and configuration for efficiently guiding air warmed in the housing 1E to the suction port 20c. Furthermore, when the aspirator 20 directly suctions air in the housing 1E from the suction port 20c, the suction pipe 21 may be omitted.

With such a configuration, in an air cooling mechanism provided in the high-frequency amplification unit 1, fresh air not warmed by the part mounted on the amplification circuit board CB is taken in from the outside of the high-frequency amplification unit 1 through the slit SL and air warmed by the part mounted on the amplification circuit board CB in the housing 1E is suctioned by the aspirator 20 from the suction port 21c and discharged from the outlet 10b along with cooling water, whereby the part mounted on the amplification circuit board CB is cooled. In other words, in the air cooling mechanism provided in the high-frequency amplification unit 1, the air in the housing 1E is suctioned using a pressure difference between pressure in the housing 1E and pressure in the suction port 20c, which is reduced by increasing the flow rate by narrowing the flow channel diameter of the cooling water in the aspirator 20, whereby the part mounted on the amplification circuit board CB is cooled. In one example shown in (a) of FIG. 3, a part constituting an amplification circuit mounted in the amplification circuit mounting region AA is mainly cooled.

Meanwhile, in an example of the configuration of the high-frequency amplification unit 1 shown in FIG. 3, the configuration of the air cooling mechanism in which the aspirator 20 is arranged at the end of the cooling water pipe 10 on the outlet 10b side is shown. This is because the aspirator 20 discharges air suctioned from the suction port 20c along with a fluid and the air discharged by the aspirator 20 is included in the cooling water flowing into the cooling water pipe 10 and cooling the cooling plate 11 in the water cooling mechanism and a water cooling function of the water cooling mechanism deteriorates if the aspirator 20 is arranged, for example, at an end of the cooling water pipe 10 on the inlet 10a side. Considering this fact, a case where it is preferable that the position where the aspirator 20 is arranged in the high-frequency amplification unit 1 be a position of the end of the cooling water pipe 10 on the outlet 10b side as shown in FIG. 3 to avoid the deterioration of the water cooling function of the water cooling mechanism is conceivable.

Thus, the air cooling mechanism provided in the high-frequency amplification unit 1 cools the inside of the high-frequency amplification unit 1 with air without using a fan used as the air cooling mechanism in the conventional MRI device. Thus, the high-frequency amplification unit 1 can be installed in the imaging room PR under a magnetic field environment or in the vicinity of the gantry device TE installed in the imaging room PR (may be located inside of the gantry device TE). Moreover, because the air cooling function is implemented at a position where the high-frequency amplification unit 1 is arranged in the air cooling mechanism provided in the high-frequency amplification unit 1, the installation of an exhaust duct or the like required in the conventional MRI device is not required and the air cooling function can be implemented more efficiently.

Although a configuration in which one aspirator 20 is arranged on the outlet 10b side of the cooling water pipe 10 for circulating cooling water in the cooling plate 11 in the water cooling mechanism provided in the high-frequency amplification unit 1 is shown in the configuration of the air cooling mechanism in the high-frequency amplification unit 1 shown in FIG. 3, the number of aspirators 20 arranged in the high-frequency amplification unit 1 for implementing the air cooling function can be two or more. For example, as the air cooling mechanism provided in the high-frequency amplification unit 1, a plurality (for example, two) of aspirators 20 may be arranged on the outlet 10b side of the cooling water pipe 10. Further, when the water cooling mechanism provided in the high-frequency amplification unit 1 has a configuration in which a plurality of cooling water pipes 10 pass through the cooling plate 11, the aspirators 20 may be arranged one by one on the outlet 10b side of each cooling water pipe 10 as the air cooling mechanism of the high-frequency amplification unit 1. [Examples of other configurations of cooling mechanism in internal unit] Meanwhile, in the MRI device, there are constituent elements using a fluid (ordinary water, cooling water, or a special liquid) flowing through the pipe, including the water cooling mechanism of the other internal unit, in addition to the water cooling mechanism of the high-frequency amplification unit 1. Therefore, the air cooling mechanism of the high-frequency amplification unit 1 may be configured using the flow rate of the fluid flowing through the pipe installed for other constituent elements provided in the MRI device.

Figure 5:
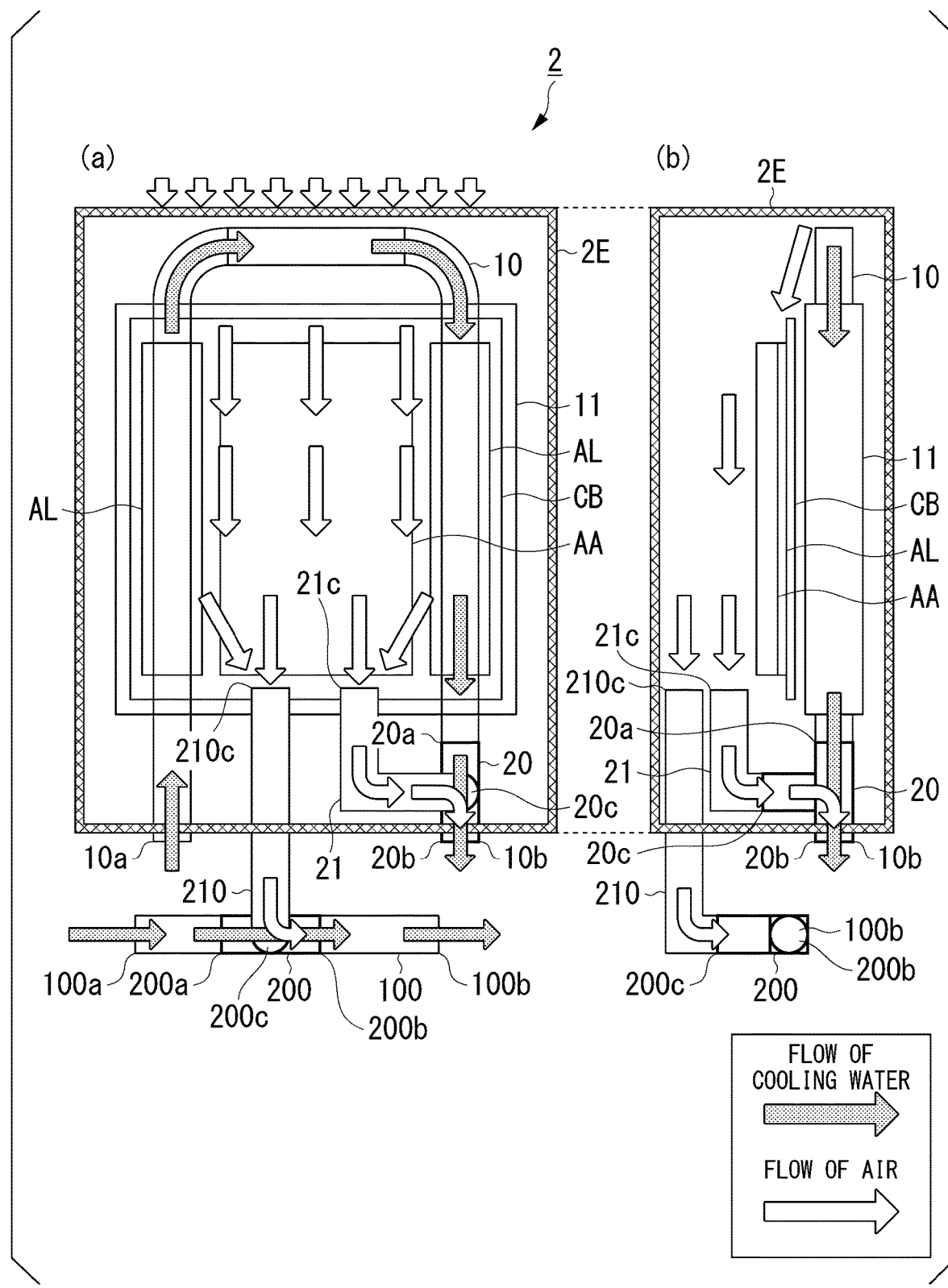
FIG. 5 is a diagram schematically showing an example of another configuration of the internal unit adopting the cooling device according to the embodiment.

FIG. 5 is a diagram schematically showing an example of another configuration of the internal unit (the high-frequency amplification unit 1) adopting the cooling device according to the embodiment. In the following description, in order to distinguish the high-frequency amplification unit 1 shown in FIG. 3 from the high-frequency amplification unit 1 of the other configuration to be described below, the high-frequency amplification unit 1 of the other configuration is referred to as a "high-frequency amplification unit 2." An example of the arrangement of constituent elements when the high-frequency amplification unit 2 is viewed from the upper surface side is shown in (a) of FIG. 5 and an example of the arrangement of constituent elements when the high-frequency amplification unit 2 is viewed from the right surface side is shown in (b) of FIG. 5.

Because constituent elements embedded in the high-frequency amplification unit 2 and cooling mechanisms (the water cooling mechanism and the air cooling mechanism) provided in the high-frequency amplification unit 2 are similar to those provided in the high-frequency amplification unit 1, they are denoted by the same reference signs and a repeated detailed description thereof is omitted.

The high-frequency amplification unit 2 is an internal unit having an air cooling mechanism for discharging air in more high-frequency amplification units 2 using the flow rate of a fluid flowing into a pipe (hereinafter referred to as the fluid pipe 100) installed outside of the high-frequency amplification unit 2 in addition to the air cooling mechanism provided in the high-frequency amplification unit 1.

In the high-frequency amplification unit 2, the aspirator 200 is arranged in the fluid pipe 100 as the air cooling mechanism for cooling the part mounted on the amplification circuit board CB, one end of the suction pipe 210 is connected to the air suction port 200c of the aspirator 200, and the other end (hereinafter referred to as the "suction port 210c") of the suction pipe 210 is arranged to be installed at any position in a housing 2E of the high-frequency amplification unit 2.

The aspirator 200 is similar to the aspirator 20. The aspirator 200 uses a fluid flowing from the inlet 100a side to the outlet 100b side in the fluid pipe 100 to suction air in the housing 2E warmed by the part mounted on the amplification circuit board CB from the suction port 210c of the suction pipe 210 and causes the air to flow to the outlet 100b side along with the fluid (discharges air warmed in the housing 2E).

The configuration of the aspirator 200 and the suction pipe 210 (which may include a slit SL) is an example of "another air cooling mechanism." The fluid pipe 100 is an example of "another pipe."

The shape of the suction pipe 210 and the configuration of the suction pipe 210, i.e., a path for guiding the air suctioned from the suction port 210c to the suction port 200c of the aspirator 200 and an air suction method, are not limited to the shape and configuration of the suction pipe 210 shown in FIG. 5, and any shape and configuration may be provided as long as they are a shape and configuration for efficiently guiding air warmed in the housing 2E to the suction port 200c.

With such a configuration, in the air cooling mechanism provided in the high-frequency amplification unit 2, it is possible to further cool a part mounted on the amplification circuit board CB when each of the aspirator 20 and the aspirator 200 suctions air warmed by a part mounted on the amplification circuit board CB in the housing 2E and discharges the air to the outside of the high-frequency amplification unit 2. In (a) and (b) of FIG. 5, examples of a flow of air when the air cooling mechanism provided in the high-frequency amplification unit 2 cools a part constituting the amplification circuit mounted in an amplification circuit mounting region AA are schematically shown.

Meanwhile, in an example of the configuration of the high-frequency amplification unit 2 shown in FIG. 5, the aspirator 200 is arranged in an intermediate portion of the fluid pipe 100. Thus, the fluid flowing through the fluid pipe 100 includes air in the housing 2E suctioned from the suction port 200c by the aspirator 200 after passing through the aspirator 200. For this reason, a case where it is preferable that the aspirator 200 be arranged at the position of the fluid pipe 100 after a constituent element using the fluid flowing through the fluid pipe 100 uses the fluid in the air cooling mechanism provided in the high-frequency amplification unit 2 is conceivable. However, the aspirator 200 may be arranged at any position of the fluid pipe 100 as long as it does not affect the implementation of the function in a constituent element using the fluid flowing through the fluid pipe 100.

Thus, like the air cooling mechanism provided in the high-frequency amplification unit 1, the air cooling mechanism provided in the high-frequency amplification unit 2 also performs air cooling in the high-frequency amplification unit 2 without using a fan used as the air cooling mechanism in the conventional MRI device and without the need of laying an exhaust duct or the like. Thus, the high-frequency amplification unit 2 can also be installed in the imaging room PR under a magnetic field environment or in the vicinity of the gantry device TE installed in the imaging room PR (may be located inside of the gantry device TE) like the high-frequency amplification unit 1 and the air cooling mechanism provided in the high-frequency amplification unit 2 can more efficiently implement an air cooling function.

Although one aspirator 20 is arranged in the cooling water pipe 10 and one aspirator 200 is arranged in the fluid pipe 100 in the configuration of the air cooling mechanism in the high-frequency amplification unit 2 shown in FIG. 5, a plurality of fluid pipes 100 or a plurality of aspirators 200 may be arranged on the basis of a concept similar to that of the air cooling mechanism in the high-frequency amplification unit 1.

[Example of Configuration of Modified Example of Cooling Mechanism Provided in Internal Unit]

A configuration in which fresh air in the imaging room PR is taken in through the slit SL, air in the housing 1E warmed by the part mounted on the amplification circuit board CB is suctioned from the suction port 21c of the suction pipe 21, and the air is discharged along with cooling water from the outlet 20b of the aspirator 20 in the high-frequency amplification unit 1 has been described. However, a case where there is a part or a region having a higher temperature in the amplification circuit board CB provided in the high-frequency amplification unit 1 is conceivable. Therefore, the high-frequency amplification unit 1 may have a configuration in which a part or a region is more efficiently cooled by focusing on the part or the region having the high temperature.

Figure 6:
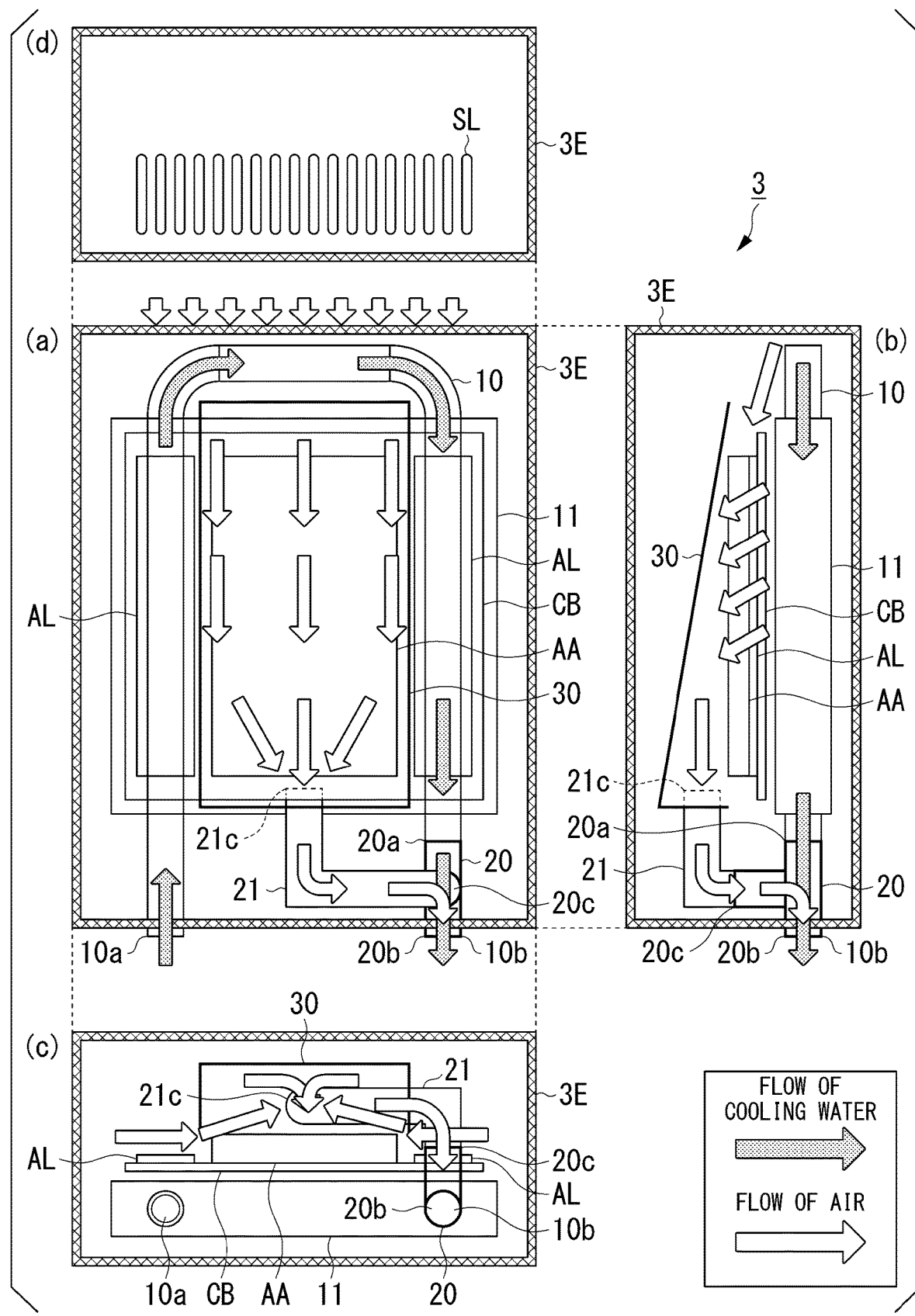
FIG. 6 is a diagram schematically showing an example of a configuration of a modified example of the internal unit adopting the cooling device according to the embodiment.

FIG. 6 is a diagram schematically showing an example of a configuration of a modified example of the internal unit (the high-frequency amplification unit 1) adopting the cooling device according to the embodiment. In the following description, the high-frequency amplification unit 1 of the configuration of the modified example is referred to as the "high-frequency amplification unit 3" to distinguish the high-frequency amplification unit 1 shown in FIG. 3 and the high-frequency amplification unit 1 having the configuration of the modified example to be described below. An example of an arrangement of constituent elements when the high-frequency amplification unit 3 is viewed from the upper surface side is shown in (a) of FIG. 6, an example of the arrangement of the constituent elements when the high-frequency amplification unit 3 is viewed from the right surface side is shown in (b) of FIG. 6, an example of the arrangement of the constituent elements viewed from the front surface side where the cooling water pipe 10 is connected to the high-frequency amplification unit 3 is shown in (c) of FIG. 6, and a rear surface view of the high-frequency amplification unit 3 viewed from the rear surface side is shown in (d) of FIG. 6.

Parts similar to those of the high-frequency amplification unit 1 are included in constituent elements embedded in the high-frequency amplification unit 3 and cooling mechanisms (a water cooling mechanism and an air cooling mechanism) provided in the high-frequency amplification unit 3. Therefore, in the following description, the constituent elements and the cooling mechanisms similar to those of the high-frequency amplification unit 1 are denoted by the same reference signs and a repeated detailed description thereof is omitted.

The high-frequency amplification unit 3 is configured by adding a guide plate 30 to the air cooling mechanism provided in the high-frequency amplification unit 1. The guide plate 30 is for guiding fresh air taken in through a slit SL to a part or a region desired to be further cooled in an amplification circuit board CB provided in the high-frequency amplification unit 3. In FIG. 6, an example of the shape of the guide plate 30 for causing more fresh air taken in through the slit SL to pass through the upper side of an amplification circuit mounting region AA of the amplification circuit board CB in a housing 3E of the high-frequency amplification unit 3 and subsequently guiding the air warmed by the amplification circuit toward a suction port 21c of a suction pipe 21 is shown to further cool the amplification circuit mounted in the amplification circuit mounting region AA. In (a), (b), and (c) of FIG. 6, examples of a flow of air guided by the guide plate 30 in the air cooling mechanism are schematically shown. Thus, in the high-frequency amplification unit 3, the amplification circuit is efficiently cooled by the taken-in fresh air, the air warmed by the amplification circuit is efficiently guided to a suction port 21c, and the guided air is suctioned from a suction port 20c side by an aspirator 20 and discharged from an outlet 20b along with the cooling water. Thus, in the high-frequency amplification unit 3, the parts constituting the amplification circuit mounted in the amplification circuit mounting region AA are more efficiently cooled.

The shape of the guide plate 30 is not limited to the shape shown in FIG. 6. The shape of the guide plate 30 may be any shape as long as it is possible to allow more fresh air taken in through the slit SL to pass through the periphery of a part or a region desired to be further cooled in the high-frequency amplification unit 3 and guide air warmed in the part or the region desired to be further cooled to the suction port 21c.

With such a configuration, in the air cooling mechanism provided in the high-frequency amplification unit 3, fresh air taken in through the slit SL is guided to a part or a region of interest to be further cooled by the guide plate 30. In the air cooling mechanism provided in the high-frequency amplification unit 3, the aspirator 20 suctions air warmed by a part or a region of interest in the housing 1E from the suction port 21c and discharges the air along with cooling water from an outlet 10b, thereby cooling the part or the region of interest desired to be further cooled. In (a), (b), and (c) of FIG. 6, examples of a flow of air when air guided by the guide plate 30 in the air cooling mechanism is discharged are schematically shown.

Thus, like the air cooling mechanism provided in the high-frequency amplification unit 1, the air cooling mechanism provided in the high-frequency amplification unit 3 also performs air cooling in the high-frequency amplification unit 3 without using a fan used as the air cooling mechanism in the conventional MRI device and without the need of laying an exhaust duct or the like. Thus, the high-frequency amplification unit 3 can also be installed in the imaging room PR under a magnetic field environment or in the vicinity of the gantry device TE installed in the imaging room PR (may be located inside of the gantry device TE) like the high-frequency amplification unit 1 and the air cooling mechanism provided in the high-frequency amplification unit 3 can more efficiently implement an air cooling function.

Although a configuration in which one aspirator 20 is arranged in the cooling water pipe 10 is shown in the configuration of the air cooling mechanism in the high-frequency amplification unit 3 shown in FIG. 6, a plurality of fluid pipes 100 may be arranged on the basis of a concept similar to that of the air cooling mechanism in the high-frequency amplification unit 1. Furthermore, in the configuration of the air cooling mechanism in the high-frequency amplification unit 3 shown in FIG. 6, the air cooling mechanism may be configured using a flow rate of a fluid flowing through a pipe installed for other constituent elements provided in the MRI device on the basis of a concept similar to that of the air cooling mechanism provided in the high-frequency amplification unit 1.

As described above, in the internal unit in which the cooling device of each embodiment is adopted, the air cooling mechanism uses a flow of cooling water in the cooling water pipe for use in the water cooling mechanism to discharge the air warmed in the housing to the outside of the cooling device. Thereby, in the MRI device, which is a medical diagnostic device including the internal unit adopting the cooling device of each embodiment, the high-temperature internal unit can be installed under a magnetic field environment and the internal unit can be efficiently cooled.

In each of the above-described embodiments, a case where the aspirator is used as the air cooling mechanism for suctioning and discharging the air warmed in the housing has been described. However, the configuration in which the air warmed in the housing is suctioned and discharged is not limited to the aspirator as long as the configuration does not use the motor, i.e., the configuration is not affected by the magnetic field environment. For example, the air cooling mechanism may be implemented with another constituent element different from the aspirator for suctioning and discharging air in the housing using the Venturi effect (a pressure difference) or a constituent element for suctioning and discharging air in the housing using technology different from the Venturi effect.

According to at least one embodiment described above, there is provided a cooling device for cooling a constituent element (CB) housed in a housing (1E) of a unit (1) subjected to an influence of a generated magnetic field, the cooling device including: a water cooling mechanism configured to cool the constituent element (CB) by cooling a cooling plate (11) with a flow of water flowing through a pipe (10) passing through the cooling plate (11) arranged in the housing (1E); and at least one air cooling mechanism arranged on an outgoing side (10b) where the flow of water flowing through the pipe (10) is outgoing from the housing (1E) and configured to cool the constituent element (CB) by discharging air in the housing (1E) along with the water flow in accordance with the water flow, whereby it is possible to install the constituent element (CB) at a high temperature under a magnetic field environment and efficiently cool the constituent element (CB) in a medical diagnostic device (an MRI device) used under an environment where there is a magnetic field.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A cooling device for cooling a constituent element housed in a housing of a unit subjected to an influence of a generated magnetic field, the cooling device comprising:
 a water cooling mechanism configured to cool the constituent element by cooling a cooling plate with a flow of water flowing through a pipe passing through the cooling plate arranged in the housing; and
 at least one air cooling mechanism arranged on an outgoing side where the flow of water flowing through the pipe is outgoing from the housing and configured to cool the constituent element by discharging air in the housing along with the water flow in accordance with the water flow,
 wherein the air cooling mechanism suctions the air in the housing using a pressure difference between a pressure of the air in the housing and a pressure which decreases with a flow rate increased by making a flow channel of the water flow thinner.

2. The cooling device according to claim 1, wherein the water cooling mechanism is a plurality of pipes are arranged in the cooling plate, and
 wherein the air cooling mechanism is arranged on the outgoing side of the water flow in each pipe.

3. The cooling device according to claim 1, wherein a plurality of air cooling mechanisms are arranged on the outgoing side of the water flow in one pipe.

4. The cooling device according to claim 1, further comprising at least another air cooling mechanism configured to cool the constituent element by suctioning the air in the housing in accordance with a flow of water flowing through another pipe passing through the outside of the housing and discharging the suctioned air along with the water flow.

5. The cooling device according to claim 1, wherein the air cooling mechanism further includes a guide plate configured to guide the air in the housing toward a suction port for suctioning the air.

6. The cooling device according to claim 1, wherein the air cooling mechanism is an aspirator.

7. The cooling device according to claim 6, wherein the constituent element implements a function of a magnetic resonance imaging device, and
 wherein the unit for the constituent element housed in the housing is placed near a gantry device for generating a magnetic field in the magnetic resonance imaging device or in a room identical to a room where the gantry device is installed.

8. The cooling device according to claim 7, wherein the constituent element implements a function of a high-frequency amplification device configured to amplify an RF pulse to be radiated to a subject placed on a subject tabletop plate in the magnetic resonance imaging device.

* * * * *